United States Patent
Grüning

Patent Number: 5,235,487
Date of Patent: Aug. 10, 1993

[54] INVERTER WITH OVERLOAD CURRENT PROTECTION

[75] Inventor: Horst Grüning, Wettingen, Switzerland

[73] Assignee: Asea Brown Boveri Ltd., Baden, Switzerland

[21] Appl. No.: 734,266

[22] Filed: Jul. 22, 1991

[30] Foreign Application Priority Data

Aug. 2, 1990 [EP] European Pat. Off. ........... 90114825

[51] Int. Cl.⁵ .......................................... H02M 7/515
[52] U.S. Cl. ................................... 361/18; 363/58
[58] Field of Search ................ 361/18; 363/55, 56, 363/98, 37

[56] References Cited

U.S. PATENT DOCUMENTS

| | | | |
|---|---|---|---|
| 4,488,213 | 12/1984 | Buikema | 363/58 |
| 4,506,196 | 3/1985 | Bees | 363/58 |
| 4,686,618 | 8/1987 | McMurray | 363/58 |
| 5,150,287 | 9/1992 | Grüning | 363/135 |

FOREIGN PATENT DOCUMENTS

0185181 6/1986 European Pat. Off. .

OTHER PUBLICATIONS

Intelec '87 Conference Proceedings, Stockholm, Jun. 14–17 1987, Seiten 531–534, J. Galic, et al., "The Application of GTO's to Convertors for UPS-Systems".
ETZ Elektrotechnisches Zeitschrift, Band 110, Nr. 10, May 1989, Seiten 464–471, W. Bostering, et al., "IGB-T-Module in Stromrichtern: Regeln, Steuern, Schutzen".
Revue Generale de l'Electricite, Nr. 2, Feb. 1986, Seiten 19–22, G. Mouries: "Evolution des Condensateurs de Poussance Secs".
19th Annual IEEE Power Electronics Specialists Conference, Kyoto, Apr. 11–14, 1988, Band 2, Seiten 1311–1318, H. Gruening, et al., "Field Controlled Thyristors-A New Family of Power Semiconductors With Advanced Circuitry".

*Primary Examiner*—Todd E. DeBoer
*Attorney, Agent, or Firm*—Oblon, Spivak, McClelland, Maier & Neustadt

[57] ABSTRACT

In an inverter with overload current projection, a half-bridge is divided in module form into two quarter-bridge branches. Disposed in the latter are a gate turn-off semiconductor component (7, 8), a freewheeling diode (9, 10) situated opposite with respect to a center point and a blocking capacitor (11, 12) in parallel with freewheeling diode (9, 10) and turn-off semiconductor component (7, 8). A measuring resistor (R1, R2) and a current-limiting component (L1, L2) are provided between a load terminal (3) of the bridge circuit and the center points of the quarter-bridge branches. The load current can be determined in a transient-free manner with the measuring resistors.

8 Claims, 1 Drawing Sheet

INVERTER WITH OVERLOAD CURRENT PROTECTION

BACKGROUND OF THE INVENTION

1. Field of the Invention

The invention relates to an inverter having overload current protection in which at least two turnoff semiconductor components are provided between a positive and a negative supply line in the sense of a half-bridge circuit.

2. Discussion of Background

When high-power semiconductor components are used, for example, in inverter circuits, a fast and an as transient free as possible current detection is of eminent importance if it is a matter of being able to respond to short circuits external to the circuit or to unintentional re-triggerings correctly and in good time. In IGBT circuits, for example, this makes it possible to turn off the power switches even after a short time in the saturation mode. IGBTs can also be utilized better if they no longer have to be so lightly triggered that they are able to withstand the saturation mode for a certain time.

Components with two-sided injection (GTO, FSGTO, FCTh, SITh, MCT etc.) can only be protected against destruction in a low-inductance supply circuit if it is possible to block them before their maximum turn-off current is reached.

SUMMARY OF THE INVENTION

The object of the invention is therefore to provide an inverter of the type mentioned in the introduction which, with a view to high operational safety, is equipped with means for monitoring the loading of the turn-off semiconductor components.

According to the invention, the solution is one wherein a) the half-bridge circuit is divided into two quarter-bridge branches in which at least one freewheeling diode is provided opposite the semiconductor component with respect to a center point, b) a current-limiting component is disposed in each case between a load terminal and the center points, and c) means are provided for measuring the current flowing from each center point to the load terminal for the purpose of re-triggering protection and detecting a load short circuit.

The said means for measuring the current may comprise, for example, a measuring resistor in series with the current-limiting component. It is, however, also possible to determine the current by integrating the voltage change across an inductance. The current detected is fed to a control circuit which, if necessary, switches off the semiconductor component.

The essence of the invention is that the current is detected with simple means in the load terminal itself (where it is substantially transient-free) and that an inductance in series additionally limits the rate of current rise in the event of a fault, so that sufficient time remains to respond. Because the commutation currents occurring when the semiconductor component is switched cannot flow through the current-detecting component (for example, the measuring resistor), the undesirable overload voltages do not appear either.

The advantages just mentioned and the fact that the current can be reliably determined at any time have the result that the current measurement according to the invention can also additionally be used directly for controlling a motor drive (supplied by the inverter). The measuring resistor according to the invention consequently takes on a double function.

It is particularly advantageous if the turn-off semiconductor components in the quarter-bridge branches are complementary semiconductor components because the measuring resistors and the gate units are then essentially at the same potential.

To avoid voltage peaks and achieve a fast triggering, the turn-off semiconductor components are triggered in a low-inductance manner via one gate unit each.

If means are present for determining a load current by means of the voltages present across the measuring resistors and for feeding them to a control circuit, the integrated current measurement in the inverter is immediately doubly utilized. Expensive external current sensors (such as are otherwise indispensable in motor drive control systems) can be omitted.

In order to be able to detect a faulty triggering of a semiconductor component in addition to an external short circuit, a separate inductance could be provided for each semiconductor component of a quarter-bridge branch.

Preferably, the quarter-bridge branches are constructed as separate LS and HS modules. In this way, the advantages of the invention can be combined with those of Swiss Patent Application CH-2106/90.

Because of their ability to be able to handle large currents and to switch with high speed, the FCTh and the CFCTh are to be particularly highlighted as turn-off semiconductor components. In the invention, the FCTh is connected by means of its anode directly to the positive supply line in a quarter-bridge branch constructed as HS branch and the CFCTh is connected by means of its cathode directly to the negative supply line in a quarter-bridge branch constructed as LS branch.

A suitable current-limiting component is, in particular, either an inductance which limits the rate of current rise or a PTC component.

In detail, the circuit according to the invention can be constructed as follows: in the quarter-bridge branches, a low-inductance blocking capacitor for absorbing the reverse recovery current peaks of the diode is provided in each case in parallel with the series circuit of semiconductor component and freewheeling diode. Freewheeling diode and blocking capacitor are disposed in a low-inductance manner and spatially immediately next to the semiconductor component. The power switches of the inverter are triggered by a gate unit in a manner known per se.

The preferred inductances can acquire a double function if they can be part of a filter for damping the voltage rise dV/dt in the load circuit.

Further advantages and embodiments emerge from the description below.

BRIEF DESCRIPTION OF THE DRAWINGS

A more complete appreciation of the invention and many of the attendant advantages thereof will be readily obtained as the same becomes better understood by reference to the following detailed description when considering in connection with the accompanying drawings, wherein.

DESCRIPTION OF THE PREFERRED EMBODIMENT

Figure 1:
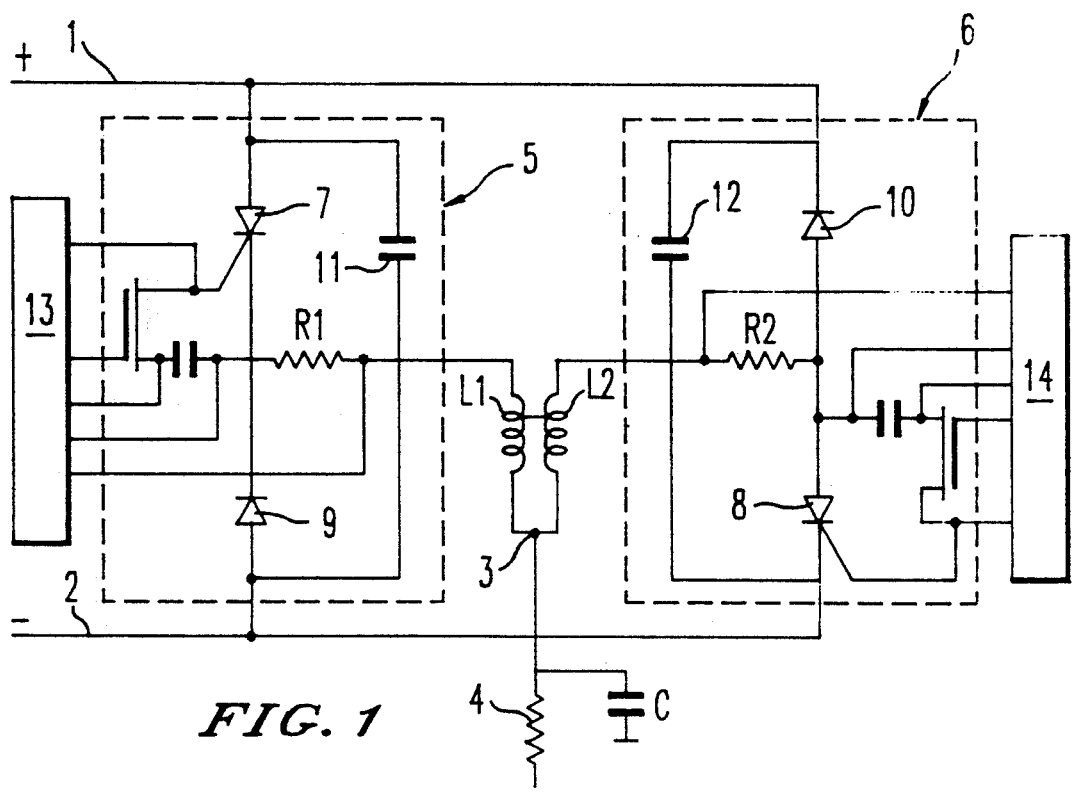
FIG. 1 is a circuit diagram of an inverter having overload current protection according to a first embodiment of the invention.

Referring now to FIG. 1, the figure shows an exemplary embodiment of an inverter circuit according to the invention. The input side of the circuit is formed by a positive and a negative supply line 1 and 2, respectively. Available on the output side is a load terminal 3 at which, for example, one of the three phases required by a three-phase motor (represented diagrammatically by load 4) is delivered.

The half-bridge shown in the figure is divided into two quarter-bridge branches. Each of the two contains a turn-off semiconductor component 7, 8, a freewheeling diode 9, 10 situated opposite with respect to a center point (to which the load terminal 3 is connected) and a blocking capacitor 11, 12.

That quarter-bridge branch in which the semiconductor component 7 is connected by means of its anode directly to the positive supply line 1 is denoted below as HS (High Side) branch. Analogously, the other quarter-bridge branch in which the semiconductor component 8 is connected by means of its cathode to the negative supply line is denoted as LS (Low Side) branch.

According to a preferred embodiment, HS branch and LS branch are each constructed as separate modules (HS and LS module 5 and 6, respectively: housings having electrical terminals). With reference to the dimensioning of the passive components and the mechanical construction, reference is made to the non-prepublished Swiss Patent Application CH-2106/90. The contents thereof should be considered as a part of the present description which is incorporated by reference.

HS module and LS module 5, 6, i.e. the turn-off semiconductor components 7, 8, are each triggered by a gate unit 13, 14 incorporating means known per se (for example MOSFET and gate capacitor).

According to a preferred embodiment of the invention, a measuring resistor R1, R2 is provided in each case between the center point of a module and the common load terminal 3. The corresponding gate unit 13, 14 contains means for measuring the voltage present across measuring resistor R1, R2 and, consequently, the current flowing to the load 4. If the measured value now reaches a specified limit value (which is, for example, in the vicinity of the maximum turn-off current) the gate unit 13 or 14, respectively, automatically blocks the semiconductor component 5 or 6, respectively.

Since no switching current flows via the measuring resistor R1 or R2, respectively, no voltage peaks which confuse the detection logic occur. As a consequence of this, an external short circuit and incorrect triggering can be reliably responded to.

According to a particularly advantageous embodiment, a small inductance L1, L2 is disposed between the load terminal 3 and the center point of a module as current-limiting component. It is wired in series with the said respective measuring resistor R1, R2 in a manner such that the latter finishes up between center point and inductance and can, according to the invention, assume a plurality of functions.

A first important function is short-circuit protection. If the current rises sharply owing to a short circuit, this fault first has to be detected and then the semiconductor component has to be switched off. Both the detection of a short circuit and the switching-off require a certain time. Assuming the base load (in the individual semiconductor component), the current must not rise above the maximum turn-off limiting current in this time.

The size of the inductance L1 or L2, respectively, must be calculated separately for every application case. If, for example, it is assumed that a module switches 200 A and blocks about 2.5 kV, the values are typically in the region of a few $\mu H$.

A second function of the inductance L1 or L2, respectively, may be to form a filter together with a capacitor C suitably disposed in the load circuit in order to screen the load 4 (for example, a motor) against voltage transients.

Figure 2:
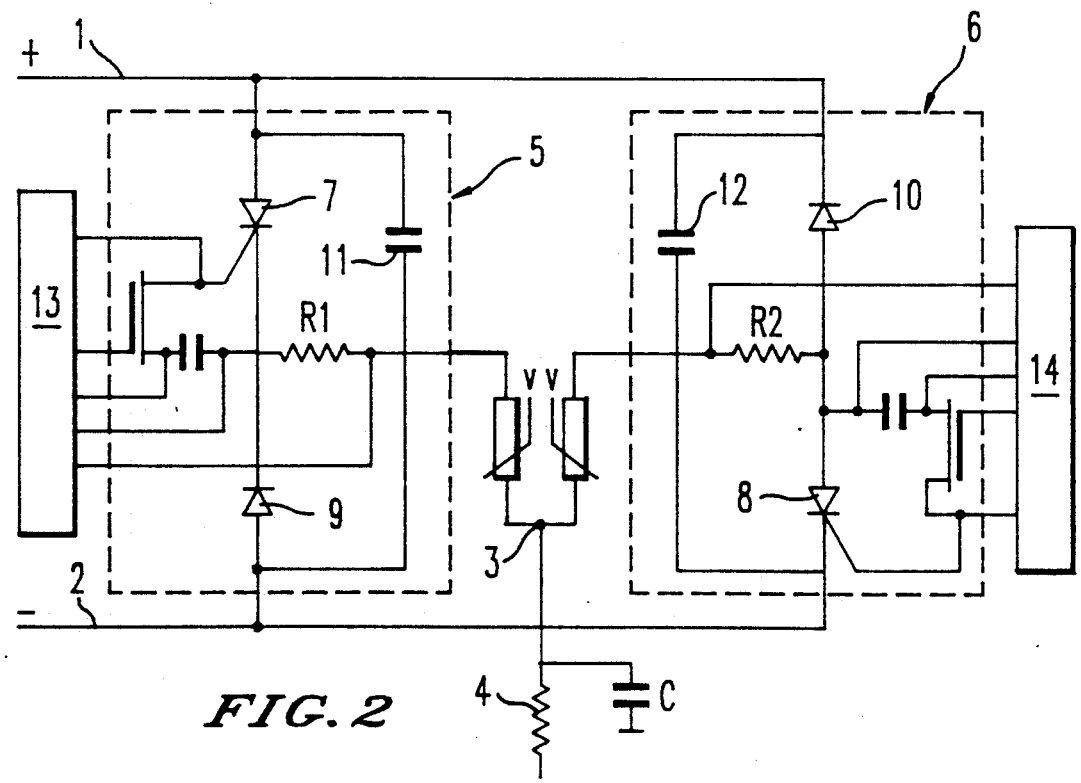
FIG. 2 is a circuit diagram of an inverter having overload current protection according to a second embodiment of this invention.

Apart from an inductance, a PTC component known per se can, for example, also be used as current-limiting component, as shown in FIG. 2. In that case, a ratio between maximum and minimum resistance is required which is in the order of magnitude of $10^4$ and over.

The current detection does not inevitably necessitate a separate measuring resistor. On the contrary, the voltage can also be tapped immediately from the PTC component.

The overload current protection implemented by means of the PTC component functions in principle as follows:
1. If a load short circuit or re-triggering occurs, the current rises sharply. The FCTh is capable of absorbing this current surge without damage (resistance to current surge due to diode characteristic).
2. The PTC heats up and begins to absorb the voltage.
3. The control logic detects the voltage across the PTC, sets, for example, an internal fault flag and waits a specified time.
4. The PTC in the meantime heats up further and begins to reduce the current below the maximum turn-off current.
5. The specified time elapses. According to a specified fault analysis, the control logic supplies the signal for turning off the FCThs. Depending on the design of the fault analysis, the turn-off signal is only emitted when a check-back signal from the current detection has taken place via the measuring resistor.

The essential point in this protection concept is that, although the turn-off component absorbs the very high current for a short time, the turn-off signal is only emitted when the separate current-limiting component has forced the current below the maximum turn-off current.

In the same way, if an inductance is used as current limitation, the current can be detected by measuring the voltage changes across the inductance and integrating them with respect to time. In this case, it is also possible to dispense with the separate measuring resistor.

It is of great advantage if a turn-off semiconductor component 8 which is complementary to that of the HS module 5 is used in the LS module 6. A complementary component is understood in this connection as meaning one in which the gate is disposed on the anode side. The effect of this measure is that the gate units 13 and 14 of the two modules are essentially at the same potential as the measuring resistors R1 and R2, respectively. This makes it possible to monitor the load current at any time without expensive additional potential separation in the control circuit of the inverter and the load.

A particularly suitable component pair in this respect is the FCTh-CFCTh ([Complementary] Field Controlled Thyristor) combination. A CFCTh (and an FSGTO) is described, for example, in the Swiss Patent Application CH-1940/90-5. The said component pair has substantially symmetrical electrical properties and is capable of handling large powers. In addition, both types of component can be triggered hard (i.e. without snubber).

In addition to the particularly preferred FCThs and CFCThs, respectively, all the fast, snubber-free switches having low storage times (switching time <200 ns) are suitable in principle as turn-off semiconductor components. These include, for example, the fine-structured GTO (see Patent Application CH-1940/90-50) or, for smaller voltages, the IGBT (Insulated Gate Bipolar Transistor).

A great advantage for practical applications is that the motor drive control controlling the inverter and monitoring the load can also use the current measurement present in the gate units 13, 14 for its own needs. For this case, means (optocoupler, inductive coupler and the like) should be provided which are suitable for conveying the measured values from the gate units 13, 14 to the central motor drive control (for example, via pulse width modulation). Particularly fast data transmission and processing are not necessary in this case since the safety functions are already fulfilled by the module. The central motor drive control can therefore concentrate on its own tasks.

To summarize, the invention is distinguished by the following special features:

1. Current transients in the measuring resistors are avoided, in particular, by the inductance arrangement according to the invention.
2. The preferred inductances limit the rate of current rise in the fault condition without having a negative effect in normal operation.
3. In the event of incorrect triggering or in the event of a fault in one power switch, the current is also able to rise when the other switches on only so slowly that enough time is left for protective turn-off. A mutual interlocking can therefore be omitted ("smart power hybrid").
4. The protection is fully operative also in the case of a parallel circuit of quarter-bridge branches.
5. Because of the simple facility for continuous current detection in the load (for example, motor), highly dynamic motor drives can also be produced economically and beneficially.

This provides a user-friendly inverter circuit which can be constructed on the building block principle.

Obviously, numerous modifications and variations of the present invention are possible in light of the above teachings. It is therefore to be understood that within the scope of the appended claims, the invention may be practiced otherwise than as specifically described herein.

List of Designations

1—positive supply line; 2—negative supply line; 3—load terminal; 4—load; 5—HS module; 6—LS module; 7, 8—turn-off semiconductor component; 9, 10—freewheeling diode; 11, 12—blocking capacitor; 13, 14—gate unit; C—capacitor; L1, L2—inductance; R1, R2—measuring resistor.

What is claimed is new and desired to be secured by Letters Patent of the United States is:

1. An inverter having overload current protection, in which at least two turn-off semiconductor components (7, 8) are provided between a positive and a negative supply line (1, 2) in the sense of a half-bridge circuit, comprising:
    a) the half-bridge circuit divided into first and second quarter-bridge branches in which at least one freewheeling diode (9, 10) is provided opposite the semiconductor component (7, 8) with respect to a center point,
    b) a current-limiting component (L1, L2) disposed in each case between a load terminal (3) and the center points, and
    c) current measuring means provided between the center point and the current limiting components (L1, L2) for measuring the current flowing from each center point to the load terminal (3) for the purpose of re-triggering protection and detecting a load short circuit.

2. The inverter as claimed in claim 1, wherein the turn-off semiconductor components (7, 8) in the quarter-bridge branches are complementary semiconductor components.

3. The inverter as claimed in claim 1, wherein the turn-off semiconductor components are triggered in a low-inductance manner via one gate unit (13, 14) each.

4. The inverter as claimed in claim 1, wherein the current measuring means in each case comprise a measuring resistor (R1, R2).

5. The inverter as claimed in claim 1, wherein the quarter-bridge branches are constructed as separate and modules (5, 6), the first branch having its semiconductor component (7) connected to the positive supply line and serving as a High-side (HS) module, the second branch having its semiconductor component (8) connected to the negative supply line and serving as a Low-side (LS) module.

6. The inverter as claimed in claim 2, wherein the turn-off semiconductor components comprise at least one Field-Controlled-Thyristor (FCTh) and one complementary-Field-Controlled-Thyristor (CFCTh), the FCTh being connected by means of its anode directly to the positive supply line (1) in the first quarter-bridge branch constructed as a High-side (HS) branch and the CFCTh being connected by means of its cathode directly to the negative supply line (2) in the second quarter-bridge branch constructed as a Low-side (LS) branch.

7. The inverter as claimed in claim 1, wherein the current-limiting components comprise either an inductance (L1, L2) which limits the rate of current rise or a PTC component.

8. The inverter as claimed in claim 1, wherein, in the quarter-bridge branches,
    a) a low-inductance blocking capacitor (11, 12) for absorbing the reverse recovery current peaks of the freewheeling diode (9, 10) is provided in parallel with the series circuit of the semiconductor component (7, 8) and the freewheeling diode (9, 10),
    b) the freewheeling diode (9, 10) and the blocking capacitor (11, 12) are disposed in a low-inductance manner and spatially immediately next to the semiconductor component (7, 8), and
    c) the semiconductor components (7, 8) are triggered by a gate unit (13, 14).

* * * * *